United States Patent [19]

Yamaga et al.

[11] Patent Number: 5,494,861

[45] Date of Patent: Feb. 27, 1996

[54] METHOD FOR HEAT-TREATING A COMPOUND SEMICONDUCTOR

[75] Inventors: Shigeki Yamaga; Chikao Kimura, both of Kamifukuoka, Japan

[73] Assignee: New Japan Radio Co., Ltd., Tokyo, Japan

[21] Appl. No.: 328,691

[22] Filed: Oct. 25, 1994

[30] Foreign Application Priority Data

Oct. 28, 1993 [JP] Japan ................................ 5-291490

[51] Int. Cl.⁶ ........................................ H01L 21/324
[52] U.S. Cl. ...................... 437/247; 437/174; 437/934; 437/987; 148/DIG. 113
[58] Field of Search ................................ 437/247, 248, 437/174, 934, 987; 148/3, 84, 113

[56] References Cited

U.S. PATENT DOCUMENTS

| | | | |
|---|---|---|---|
| 4,830,983 | 5/1989 | Thornton | 437/162 |
| 4,879,259 | 11/1989 | Reynolds et al. | 437/247 |
| 4,944,834 | 7/1990 | Tada et al. | 156/620.5 |
| 5,091,044 | 2/1992 | Tanaka | 118/725 |
| 5,202,283 | 4/1993 | Younger et al. | 437/81 |
| 5,306,895 | 4/1994 | Ushikoshi et al. | 118/725 |
| 5,356,476 | 10/1994 | Foster et al. | 118/725 |

*Primary Examiner*—George Fourson
*Assistant Examiner*—Thomas G. Bilodeau
*Attorney, Agent, or Firm*—Armstrong, Westerman, Hattori, McLeland & Naughton

[57] ABSTRACT

A method for heat-treating a compound semiconductor comprising a step of heat-treating a susceptor in a manner as to be disposed on a surface of the compound semiconductor with oposing each other, the susceptor comprising a compound of nitrogen and a group III element such as aluminum nitride.

4 Claims, 3 Drawing Sheets

METHOD FOR HEAT-TREATING A COMPOUND SEMICONDUCTOR

BACKGROUND OF THE INVENTION

The present invention relates to a method for heat-treating compound semiconductor substrates, compound semiconductor epitaxial thin films and the like and, more particularly, to a method for heat-treating using an infrared lamp.

When an impurity which is introduced into a substrate of a III-V compound semiconductor such as gallium arsenide by ion implantation or the like is to be used as a carrier, a heat treatment called "activation" required for restoring crystal defects which arise on the ion implantation and causing impurity atoms thus introduced to move to desired lattice sites. In general, the temperature of this heat treatment is higher than the evaporating temperature of arsenic, an element constituting a gallium arsenide substrate. Accordingly, the heat treatment causes arsenic molecules to evaporate from the surface of the semiconductor substrate to form arsenic vacancy therein. This arsenic vacancy raises problems of a decreased activation rate and unevenness of the semiconductor substrate surface. Further, the gallium remaining on the substrate surface causes a problem of a variation in electronic device characteristics. There have been proposed approaches to prevent such evaporation of arsenic molecules, including cap anneal method, anneal method controlling ambient atmosphere, and a method in which the surface of a substrate is brought into contact with a susceptor.

Of these approaches the most convenient and effective one is the method comprising the steps of disposing a susceptor so as to be contacted with a surface of the compound semiconductor substrate in which an ion is implanted, and heat-treating the substrate. Particularly when a gallium arsenide substrate is heat-treated by the lamp anneal method employing an infrared lamp as a heating source, such a susceptor is indispensable that the gallium arsenide substrate scarcely absorbs infrared ray, and absorbs infrared ray instead to heat the substrate by heat conduction. It is highly advantageous to utilize this susceptor in preventing evaporation of arsenic.

The lamp anneal method is a method for rapidly heating and cooling an object in a short time and, hence, a susceptor for use in the lamp anneal method is desired to exhibit the following characteristics:

(1) being physically and chemically stable at elevated temperatures as high as 1000° C. or above;
(2) being processable for realizing a highly planar surface to be contacted by a heated material;
(3) having a small heat capacity and a high thermal conductivity;
(4) absorbing infrared ray from a heating source efficiently; and
(5) not absorbing elements evaporated from the heated material.

A single-crystalline silicon substrate or porous carbon substrate has been used for a susceptor used in the conventional lamp anneal method. The single-crystalline silicon substrate is advantageous in that it is chemically stable at elevated temperatures at most 1000° C. or above and is processable for obtaining a high planarity. However, when subjected to rapid heating and cooling, the single-crystalline silicon substrate may suffer deformation due to heat such as warp or surface defects such as microslip. This causes the susceptor comprising the single-crystalline silicon substrate to contact gallium arsenide substrate differently at every heat treatment, thus leading to problems of insufficient evenness in the plane of a gallium arsenide substrate and an unsatisfactory reproducibility among test pieces of gallium arsenide substrates. Further, since silicon has an absorption band which scarcely overlaps the wavelength region of a light beam of an infrared lamp serving as the heat source, the single-crystalline silicon substrate is low in heating efficiency and hence is unsuitable for rapid heating and cooling. Furthermore, the solid solubility of arsenic with respect to silicon is as high as $1 \times 10^{21}/cm^3$, and when under a condition higher than that value, an arsenic compound is produced. Accordingly, there arises a problem that the single-crystalline silicon susceptor itself absorbs the arsenic evaporated from the surface of the gallium arsenide substrate.

On the other hand, the carbon substrate is excellent in that it absorbs infrared ray in the wavelength region of a light beam of the infrared lamp, but involves a drawback of unsuitableness for rapid heating and cooling in a short time due to a large heat capacity thereof. Further, the carbon substrate is porous and hence serves to absorb the arsenic evaporated from the gallium arsenide substrate.

As described above, the single-crystalline silicon substrate or porous carbon substrate conventionally used for the susceptor for use in the lamp anneal method cannot be considered an optimum material for the susceptor. In addition, there has not been provided any other optimum materials for the susceptor.

It is, therefore, an object of the present invention to overcome the problem that the conventional heat treating method for a compound semiconductor such as gallium arsenide has not been provided with an optimum material for a susceptor, and to provide an excellent heat treating method using an optimum material for the susceptor.

These and other objects, features and advantages of the present invention will become apparent from the following detailed description.

SUMMARY OF THE INVENTION

According to the present invention, there is provided a method for heat-treating a compound semiconductor comprising steps of (a) disposing a susceptor in a manner as to be disposed on a surface of said compound semiconductor with opposing each other, and
(b) heat-treating said compound semiconductor, wherein said susceptor comprises a compound of nitrogen and a group III element.

The compound semiconductor may contain at least one compound selected from the group consisting of gallium arsenide, aluminum gallium arsenide, indium gallium arsenide and aluminum indium gallium arsenide.

The compound semiconductor may comprise a compound in which a part of arsenic or all of arsenic is substituted by phosphorous and/or nitrogen, The compound of nitrogen and said group III element may contain at least one compound selected from the group consisting of gallium nitride, aluminum nitride, aluminum gallium nitride and boron nitride.

It is preferable that the heat-treating is a lamp anneal heat-treating.

It is preferable that the susceptor comprises a sintered material.

DETAILED DESCRIPTION

The present invention will now be described in detail with reference to the drawings.

Figure 1:
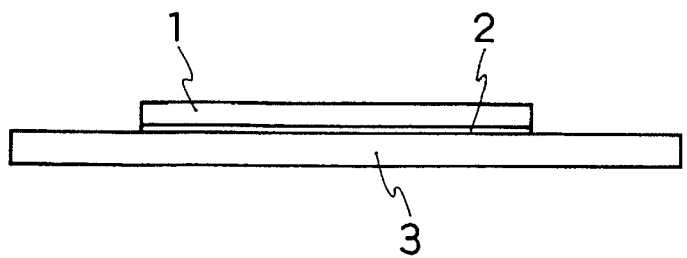
FIG. 1 is a sectional view for illustrating one example of the present invention.

There is shown in FIG. 1 such a state that a surface of a compound semiconductor substrate is disposed in opposed relation to a susceptor according to one example of a heat treating method of the present invention.

In FIG. 1, numeral 1 denotes a gallium arsenide substrate, numeral 2 an impurity-implanted region formed by ion-implanting an impurity into a surface of the gallium arsenide substrate 1, and numeral 3 a susceptor. The impurity-implanted region 2 in the surface of the gallium arsenide substrate 1 is disposed in parallel-opposed relation to the susceptor 3 either in dose contact with each other or with a slight gap therebetween. Then the substrate 1 is heat-treated by a lamp anneal method using an infrared lamp (not shown) as a heat source. The surface of the susceptor 3 has been planarized so that the impurity-implanted region 2 of the gallium arsenide 1 can be positioned in parallel, opposing relation to the susceptor 3 either in dose contact with each other or with a slight gap therebetween.

The heat treatment causes arsenic of the gallium arsenide substrate 1 to evaporate from the surface of the substrate 1. To prevent the susceptor 3 from absorbing such evaporated arsenic, the susceptor 3 is comprised of a sintered aluminum nitride material. This is because the compound constituting the susceptor 3 is required to comprise such elements as not to cause replacement reaction with arsenic atoms. That is, it is indispensable to the constitution of the present invention that the susceptor 3 comprise a compound having a binding energy larger than that between gallium and arsenic. In other words, generally speaking, the higher a melting point of the compound is, the larger the binding energy of the compound is. For that reason, the susceptor comprises a compound of which melting point is higher than that of the other compound arsenic obtained by reacting with arsenic element. If, for example, the susceptor comprises gallium antimonide of which melting point is 700° C., whereas the melting point of gallium arsenide is 1240° C., arsenic continuously substitutes antimony to produce gallium arsenide at the surface of the susceptor 3 and, hence, the evaporation of arsenic from the heated gallium arsenide substrate cannot be prevented. Further, it is required to select a material which, per se, will not absorb arsenic as the material constituting the susceptor. For instance, single-crystalline silicon does not cause replacement reaction with arsenic but aborbs arsenic because of a high solid solubility. Such a material must be precluded. As a matter of course, a material to be used in the susceptor is also required to exhibit the aforementioned favorable characteristics. Examples of compounds having such characteristics include, as well as aluminum nitride, gallium nitride, aluminum gallium nitride, boron nitride and mixtures thereof.

The susceptor is preferably of a sintered material since sintered materials in general are less deformable due to heat because grains thereof relax thermal stress. Further, since sintered materials comprising the aforementioned compounds are polycrystalline, grains thereof cause light to be scattered and, hence, the reflectivity thereof is very low. Furthermore, the sintered material of the susceptor contains a binder that absorbs infrared ray and hence performs an excellent heating efficiency. The material offering such excellent characteristics as less heat deformability and good heating efficiency results in an excellent susceptor ensuring a stable contact between a heated material and the susceptor. Thus, by using a susceptor comprising a compound of a group III element and nitride or a mixture thereof such as gallium nitride of which melting point is about 1500° C., aluminum nitride of which melting point is about 2200° C. or boron nitride of which melting point is about 3000° C. or preferably a sintered material thereof, an excellent heating method according to the present invention is provided.

As the compound semiconductor subjected to a heat treatment, it is preferable to comprise a compound of a group III element and arsenic such as gallium arsenide, aluminum gallium arsenide, indium gallium arsenide, aluminum indium gallium arsenide or a substitution compound in which a part of arsenic or all of arsenic is substituted by phosphorus.

Hereinafter, one example of the present invention using a susceptor of aluminum nitride will be described in further detail.

TABLE 1

|  | Specific heat (cal/g) | Thermal conductivity (W/mK) | Melting point (°C.) | Coefficient of linear expansion (× 10⁻⁶/°C.) |
| --- | --- | --- | --- | --- |
| Single-crystalline silicon | 0.183 | 148 | 1414 | 2.4 |
| Sintered aluminum nitride material | 0.169 | 170 | 2200 | 5.0 |

Table 1 shows the characteristics of single-crystalline silicon used in a conventional susceptor and those of sintered aluminum nitride material. As is apparent from Table 1, the sintered aluminum nitride material has a small specific heat and a high thermal conductivity, as compared to single-crystalline silicon. This indicates that the sintered aluminum nitride material is possible to be rapidly heated and cooled in a short time and hence is excellent as the material of a susceptor. The stability of the sintered aluminum nitride material at elevated temperatures is high because of its high melting point. Further, since the thermal expansion coefficient of the sintered aluminum nitride material is approximate to that of gallium arsenide ($5.7 \times 10^{-6}$/°C.), the influences of stress on a subject for heating can be advantageously minimized particularly when the subject is a gallium arsenide substrate. Consequently, the sintered aluminum nitride material is physically and chemically stable at elevated temperatures higher than 1000° C. and is excellent in heat capacity and thermal conductivity.

Further, the sintered aluminum nitride material is possible to be shaped into a susceptor having a diameter of 100 mm, a thickness of 500 µm and a surface planarity (or evenness)

of smaller than 0.03 μm for use in for example heat-treating, such as, a gallium arsenide substrate of 3 in diameter. Hence, the sintered aluminum nitride material has such a processability to be lapped by using a normal lapping compound.

Figure 2:
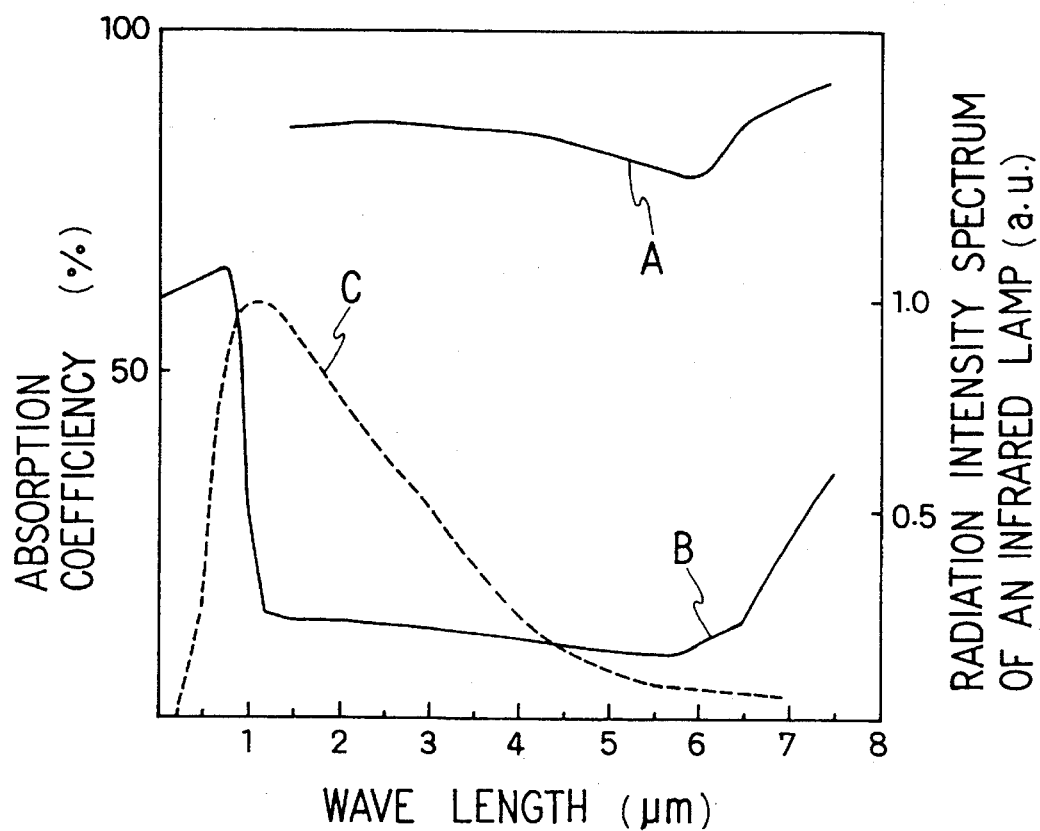
FIG. 2 is a graphic expression for showing the effect of one example of the present invention in comparison with a conventional method.

FIG. 2 shows the comparison between the absorption coefficiency of the sintered aluminum nitride material and single-crystalline silicon in the radiation wavelength region of an infrared lamp for use in the lamp anneal method, together with the radiation intensity spectrum of the infrared lamp. In FIG. 2, curve A indicates the absorption coefficiency of the sintered aluminum nitride material, curve B that of single-crystalline silicon, and curve C the radiation intensity of the infrared lamp, said radiation intensity being indicated by a relative value when maximum intensity is "1". It is apparent from the comparison that single-crystalline silicon scarcely absorbs radiation in the radiation wavelength band of the lamp, while the sintered aluminum nitride material has a high absorption coefficiency in that band. Since the sintered aluminum nitride material has a small specific heat as described above, a susceptor of the sintered aluminum nitride material is expected to efficiently absorb infrared ray and heated very rapidly in a short time.

Figure 3:
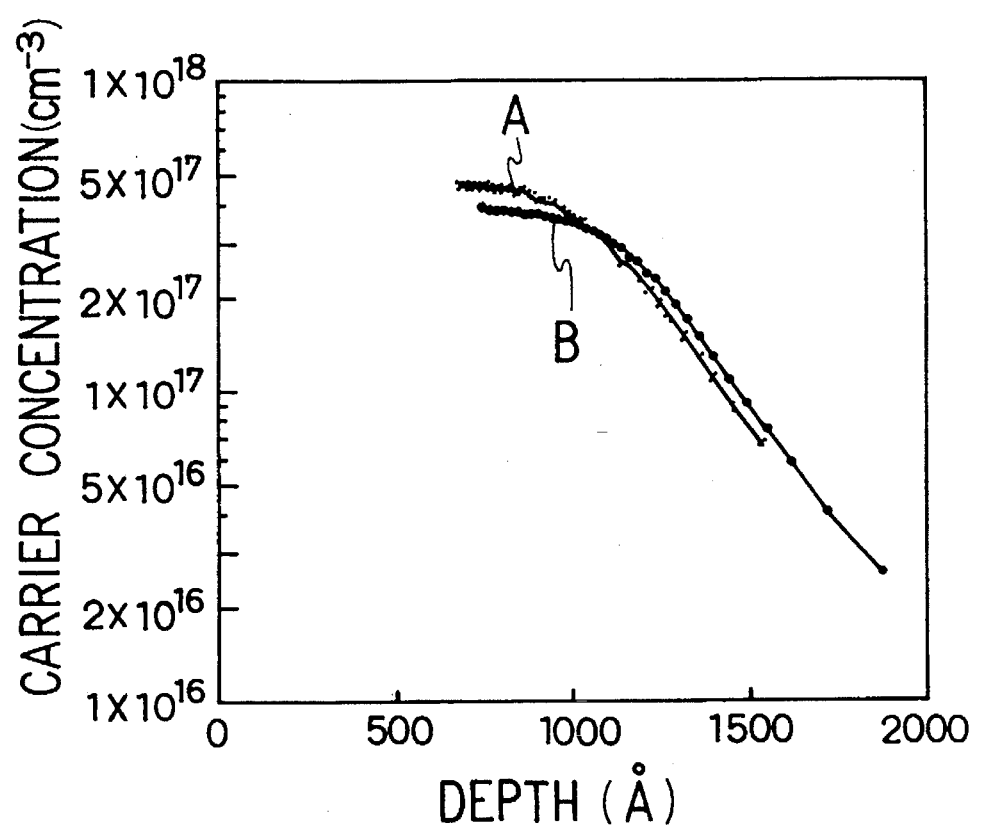
FIG. 3 is a graphic expression for showing the effect of one example of the present invention in comparison with a conventional method.

FIG. 3 is a graphic expression comparing the depth profiles of carrier concentration of gallium arsenide substrates that were ion-implanted under the same conditions but heat-treated using a susceptor of the sintered aluminum nitride material and that of single-crystalline silicon substrate, respectively. In FIG. 3, profile A was obtained in the case of the susceptor of the sintered aluminum nitride material and profile B was obtained in the case of the susceptor of single-crystalline silicon. In the ion implantation of impurity herein performed, silicon ion was implanted to undoped gallium arsenide substrates at an implant energy of 70 keV and an implant dose (or ion doses) of $7 \times 10^{12}$ cm$^{-2}$ and then magnesium ion was implanted to the same substrates at an implant energy of 170 keV and an implant dose of $5 \times 10^{11}$ cm$^{-2}$. Thereafter, the substrates were subjected to a heat treatment at 950° C. for seven seconds by the lamp anneal method and then measured for their carrier concentration profiles.

As shown in FIG. 3, the maximum carrier concentration in the substrate heat-treated using the susceptor of the sintered aluminum nitride material was higher than that in the substrate heat-treated using the susceptor of single-crystalline silicon. This indicates that the use of the sintered aluminum nitride material ensures a higher activation rate. In addition, the carrier concentration profile in the case of the sintered aluminum nitride material steep, which indicates that a satisfactory annealing for activation was realized. This is conceivable because single-crystalline silicon was less rapidly heatable than the sintered aluminum nitride material and acted to absorb arsenic. In detail, it is considered that arsenic vacancy was developed in the gallium arsenide substrate surface during the heat treatment, and implanted silicon donor was trapped by the arsenic vacancy to lower the activation rate thereof, whereby the steepness of the profile was degraded. From these results, the sintered aluminum nitride material is concluded to be an excellent material for the susceptor.

Figure 4:
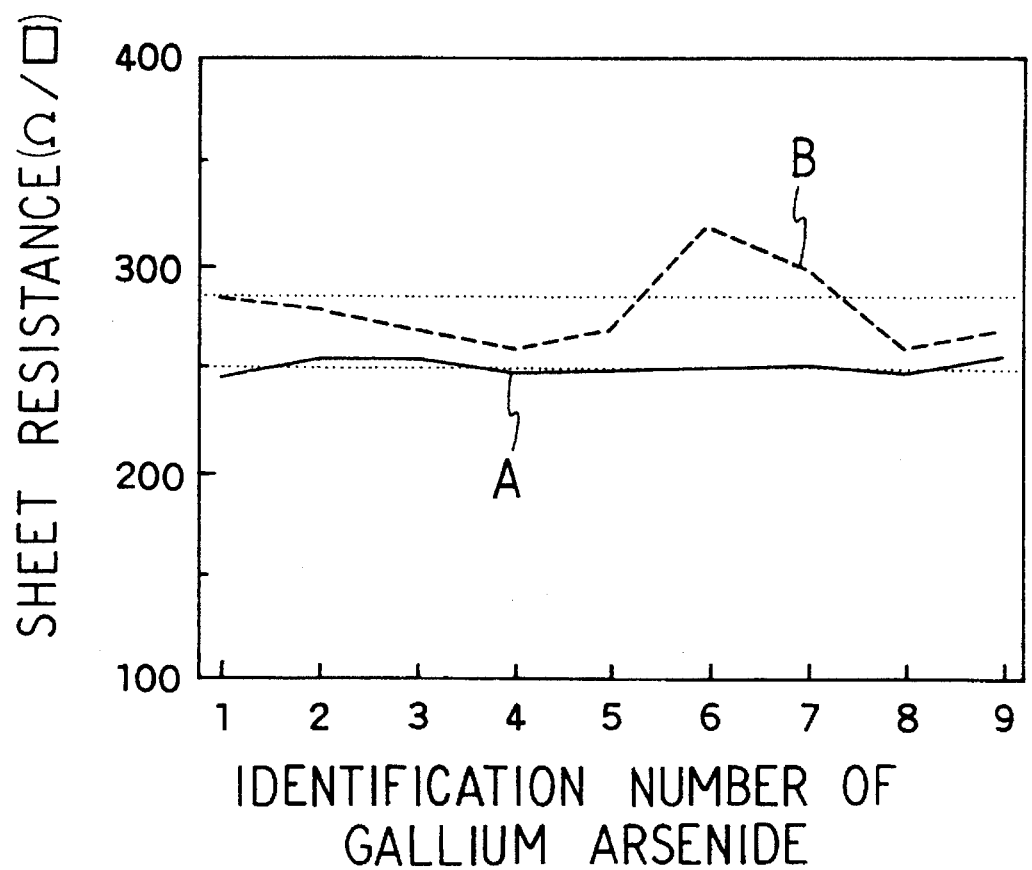
FIG. 4 is a graphic expression for showing the effect of one example of the present invention in comparison with a conventional method.

FIG. 4 is a graphic expression for comparing the variation in sheet resistance of nine samples, each of which were heat-treated, said susceptor being both the sintered aluminum nitride material and single-crystalline silicon material. In FIG. 4, curve A was obtained in the case of the susceptor of the sintered aluminum nitride material, and curve B was obtained in the case of the susceptor of single-crystalline silicon. In the ion implantation of impurity herein performed, silicon ion was implanted to undoped gallium arsenide substrates at an implant energy of 120 keV and a dopant dose of $1.1 \times 10^{13}$ cm$^{-2}$ and then magnesium ion was implanted to the substrates at an implant energy of 170 keV and a dopant dose of $5 \times 10^{11}$ cm$^{-2}$. Thereafter, the substrates were subjected to a heat treatment at 950° C. for seven seconds by the lamp anneal method and then measured for their sheet resistances. It is to be noted that FIG. 4 shows the results of the measurement on nine pieces of gallium substrates for each case.

As can be understood from FIG. 4, the sheet resistances of the substrates heat-treated using the susceptor of the sintered aluminum nitride material were lower in absolute value and smaller in variation than those of the substrates heat-treated using the susceptor of single-crystalline silicon. The variation in sheet resistance was within the range of ±5% in the case where the sintered aluminum nitride material was used for the susceptor. Single-crystalline silicon known to significantly deform due to a high temperature. Therefore, it is conceivable that the significant variation in sheet resistance among the substrates heat-treated using the susceptor of single-crystalline silicon was due to the variation in contact state between the gallium arsenide substrates and the susceptor of single-crystalline silicon. From these results, the sintered aluminum nitride material is also found to be an excellent material for nitridation of the susceptor from the viewpoint of reproducibility.

As described above, the sintered aluminum nitride material meets all the aforementioned requirements and hence is an excellent material for the susceptor. The sintered aluminum nitride material is formed by mixing aluminum nitride powder as a source material and a binder and sintering the mixture. The sintered material formed by using fully nitridated aluminum nitride as a source material under sintering conditions such as not to lower the nitridation rate exhibits the aforementioned desired characteristics. To maintain the nitridation rate, there is required to regulate the amount of the binder and that of oxygen contained in the atmosphere used in the sintering.

Although the foregoing description has been directed to the sintered aluminum nitride material by way of example, a compound of a group III element and nitrogen such as gallium nitride of which melting point is about 1500° C., and coefficient of linear expansion is $5.5 \times 10^{-6}$/°C. and boron nitride of which melting point is about 3000° C. and coefficient of linear expansion is $3.5 \times 10^{-6}$/°C., also are materials of a compound which is not easily reacted, high melting point, low heat capacity and high thermal conductivity like aluminum nitride. Such characteristics are maintained even when these materials are sintered and, hence, sintered gallium nitride material and sintered boron nitride material will exhibit effects similar to those exhibited by the sintered aluminum nitride material.

In the foregoing description, the sintered aluminum nitride material has been exemplified as a representative of sintered materials of low heat capacity and high thermal conductivity for a susceptor to be used particularly in the lamp anneal method adapted for rapid heating and cooling. However, the heat treatment of the present invention is not limited to the lamp anneal method. For example, in the furnace anneal method adapted for a relatively long time heat treatment, a susceptor need not strictly meet the aforementioned requirements. susceptor for use in a relatively long time heat treatment is required to comprise a compound which does not cause a substitutional reaction with an element evaporated from a compound semiconductor at a heat-treatment temperature and is less deformable due to high temperatures. A heat treatment method using such a susceptor offers advantages over the conventional method. Accordingly, it is a matter of optional selection depending on the temperature or duration of a heat-treatment which of the materials is to be used for the susceptor, a single compound, a mixture thereof or a sintered material thereof or at what ratio the source material is to be mixed with a binder to form a desired sintered material.

As has been described, the heat-treatment method according to the present invention wherein a susceptor is used which comprises a compound or sintered material thereof such as not to cause a substitutional reaction with an element evaporated from a subject for heating during the heat-treatment can realize a high activation rate and a stable reproducibility in activation annealing of a compound semiconductor substrate implanted with an impurity. When electronic devices such as FETs and ICs are fabricated using compound semiconductor substrates heat-treated by the method of the present invention, great improvements can be expected in performance and production yield of the devices.

While only certain presently preferred embodiments have been described in detail, as will be apparent with those familiar with the art, certain changes and modifications can be made without departing from the spirit and scope of the invention as defined by the following claims.

What is claimed is:

1. A method for heat-treating for activation of a compound semiconductor which is provided with an impurity-implanted region formed in a surface thereof, comprising steps of
   (a) disposing a susceptor in opposing relation to the impurity-implanted region in the surface of said compound semiconductor, wherein said susceptor comprises aluminum nitride, and
   (b) lamp anneal heat-treating said compound semiconductor to activate the impurity-implanted region.

2. The method of claim 1, wherein said compound semiconductor contains a compound selected from the group consisting of gallium arsenide, aluminum gallium arsenide, indium gallium arsenide and aluminum indium gallium arsenide.

3. The method of claim 2, wherein said compound semiconductor comprises a compound in which a part of arsenic or all of arsenic is substituted by phosphorous and/or nitrogen.

4. The method of claim 1, wherein said susceptor comprises a sintered material.

* * * * *